(12) United States Patent
Ritter et al.

(10) Patent No.: US 9,859,184 B2
(45) Date of Patent: Jan. 2, 2018

(54) METHOD OF MAKING A PLURALITY OF SEMICONDUCTOR DEVICES

(71) Applicant: Nexperia B.V.

(72) Inventors: Hans-Martin Ritter, Hamburg (DE); Frank Burmeister, Hamburg (DE)

(73) Assignee: Nexperia B.V., Eindhoven (NL)

( * ) Notice: Subject to any disclaimer, the term of this patent is extended or adjusted under 35 U.S.C. 154(b) by 0 days.

(21) Appl. No.: 15/196,982

(22) Filed: Jun. 29, 2016

(65) Prior Publication Data

US 2017/0033029 A1   Feb. 2, 2017

(30) Foreign Application Priority Data

Jul. 27, 2015   (EP) .................................... 151784458

(51) Int. Cl.
*H01L 23/31* (2006.01)
*H01L 27/02* (2006.01)
(Continued)

(52) U.S. Cl.
CPC ........ *H01L 23/3178* (2013.01); *H01L 21/561* (2013.01); *H01L 21/565* (2013.01);
(Continued)

(58) Field of Classification Search
CPC ............. H01L 23/3178; H01L 27/0207; H01L 23/49811; H01L 21/565; H01L 21/561; H01L 24/94; H01L 23/3114; H01L 21/78; H01L 2224/94; H01L 23/3107; H01L 23/3121; H01L 21/4832; H01L 21/56; H01L 23/28; H01L 27/14632;
(Continued)

(56) References Cited

U.S. PATENT DOCUMENTS 7,735,009 B2 * 6/2010 Aharoni .............. G06F 17/2247
                                                        715/256
8,555,492 B2 * 10/2013 Wang ....................... B26D 3/06
                                                         29/846

(Continued)

OTHER PUBLICATIONS

Extended European Search Report for Patent Appln. No. 15178458.4 dated Jan. 21, 2016.

*Primary Examiner* — Yasser A Abdelaziez
(74) *Attorney, Agent, or Firm* — Ohlandt, Greeley, Ruggiero & Perle, L.L.P.

(57) ABSTRACT

A method of making a plurality of semiconductor devices comprising a chip scale packages. The method includes providing a semiconductor wafer having a major surface and a backside. The method also includes forming a plurality of contacts on the major surface. The method further includes forming a plurality of trenches in the major surface of the substrate. The method also includes forming a plurality of openings in the wafer between the backside and the trenches in the major surface. The method further includes depositing an encapsulant on the backside of the wafer. At least some of the encapsulant passes through the openings in the wafer to at least partially fill the trenches in the major surface. The method also includes singulating the wafer to produce a plurality of chip scale packages having a major surface including one or more contacts and side walls at least partially covered with said encapsulant.

10 Claims, 5 Drawing Sheets

(51) Int. Cl.
  *H01L 23/498* (2006.01)
  *H01L 21/56* (2006.01)
  *H01L 21/78* (2006.01)
  *H01L 23/00* (2006.01)

(52) U.S. Cl.
  CPC .......... *H01L 21/78* (2013.01); *H01L 23/3114* (2013.01); *H01L 23/49811* (2013.01); *H01L 24/94* (2013.01); *H01L 27/0207* (2013.01); *H01L 2224/94* (2013.01)

(58) Field of Classification Search
  CPC . H01L 2223/54486; H01L 2225/06582; H01L 2225/06586
  See application file for complete search history.

(56) References Cited

U.S. PATENT DOCUMENTS

| | | |
|---|---|---|
| 2004/0110323 A1 | 6/2004 | Becker et al. |
| 2007/0018324 A1 | 1/2007 | Kwon et al. |
| 2008/0009102 A1 | 1/2008 | Yang et al. |
| 2009/0246938 A1* | 10/2009 | Kim .................. H01L 21/78 438/462 |
| 2011/0018143 A1 | 1/2011 | Chua et al. |
| 2011/0263097 A1 | 10/2011 | Yoshimura et al. |
| 2012/0025354 A1* | 2/2012 | Sasaki ................ H01L 21/561 257/620 |
| 2017/0011979 A1* | 1/2017 | Wilcoxen ........... H01L 23/3114 |

* cited by examiner

METHOD OF MAKING A PLURALITY OF SEMICONDUCTOR DEVICES

CROSS-REFERENCE TO RELATED APPLICATIONS

This application claims the priority under 35 U.S.C. §119 of European Patent application no. 15178458.4, filed on Jul. 27, 2015, the contents of which are incorporated by reference herein.

FIELD OF THE INVENTION

This invention relates to a method of making a plurality of semiconductor devices comprising a chip scale packages. This invention also relates to a semiconductor wafer.

BACKGROUND OF THE INVENTION

The ongoing miniaturisation of semiconductor devices has led to a need to miniaturise device packages in ways that do not adversely affect the electrical performance of the device.

In the field of discrete devices this trend has led to chip scale packages (CSPs). This type of package generally includes a semiconductor die having a major surface and a backside. Electrical contacts of the device are provided on the major surface. The package may be surface mounted on a carrier such as a printed circuit by placing it on the carrier with the major surface facing downwards. This may allow the contacts on the major surface to be soldered to corresponding contacts on the carrier. Chip scale packages may use little or no mould compound (encapsulant).

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a method of making a plurality of semiconductor devices comprising chip scale packages, the method comprising:

providing a semiconductor wafer having a major surface and a backside;

forming a plurality of contacts on the major surface;

forming a plurality of trenches in the major surface of the substrate;

forming a plurality of openings in the wafer between the backside and the trenches in the major surface;

depositing an encapsulant on the backside of the wafer, wherein at least some of the encapsulant passes through the openings in the wafer to at least partially fill the trenches in the major surface; and singulating the wafer along the trenches to produce said plurality of chip scale packages, each chip scale package having a major surface including one or more contacts and side walls at least partially covered with said encapsulant.

The encapsulant that at least partially covers the side walls of each chip scale package may prevent or mitigate electrical shorting or capacitive coupling between the side walls and any excess solder used to mount the chip scale package on a carrier. The provision of the plurality of openings in the wafer may allow the encapsulant to be deposited via the backside of the wafer. The encapsulant may thus be provided in a manner that is flexible with respect to the major surface and contacts provided thereon. For instance, there may be no need to keep the major surface uncovered while the encapsulant is deposited.

The trenches in the major surface of the wafer may form guidelines for the eventual singulation of the wafer following deposition of the encapsulant. The trenches may thus allow the encapsulant to reach and at least partially cover the eventual side walls of each chip scale package.

Forming a plurality of openings in the wafer between the backside and the trenches in the major surface may include forming a plurality of trenches in the backside of the wafer. The openings may be formed at intersections between the trenches in the major surface and the trenches in the backside of the wafer. The trenches may, for instance, be formed by partial sawing or plasma etching of the wafer. The use of trenches in both the major surface and the backside of the wafer may provide a considerable degree of flexibility for choosing the locations of the openings.

For instance, the trenches in the backside of the substrate and in the major surface of the substrate may be arranged in a grid. The pitch of the trenches of the grid may be selected to determine the locations of the openings in the wafer (e.g. a larger pitch may require less processing (e.g. sawing) and result in fewer openings with a larger distance between). A smaller pitch may result in a larger number of openings, allowing greater access for the encapsulant to the trenches in the major surface. In some examples, a pitch of the trenches in the backside is the same as a pitch of the trenches in the major surface—this is believed to provide a good balance between the amount of processing (e.g. sawing) required and the accessibility of the trenches in the major surface by the encapsulant.

The trenches in the backside may be offset with respect to the trenches in the major surface when viewed from above the major surface. The offset between the trenches in the backside and in the major surface may allow the locations of the openings to be fine-tuned.

In some examples, the offset between the trenches may be substantially equal to one half the pitch of the trenches. In this way, the intersections between the trenches (and thus openings) may be located approximately half way along the side wall of each portion of the wafer that will subsequently form a chip scale package after singulation. This may allow substantially equal spreading of the encapsulant as it enters the trenches in the major surface through the openings in the wafer.

The wafer may have a thickness $T_{wafer}$. The trenches in the major surface may have a depth $d_{major}$. The trenches in the backside have a depth $d_{backside}$. The combined depth of the trenches in the major surface and the trenches in the backside may exceed the thickness of the wafer: $d_{major} + d_{backside} > T_{wafer}$. This may provide for a degree of tolerance in the exact depth of the trenches for ensuring that the openings are correctly formed and/or may increase the effective size of each opening for allowing the encapsulant to pass into the trenches in the major surface.

In some examples, forming a plurality of openings in the wafer between the backside of the wafer and the trenches in the major surface may include forming a plurality of holes extending between the backside of the wafer and the trenches in the major surface. This may be achieved, for instance, by local plasma etching or by mechanical drilling. The use of holes for forming the openings may allow for selective placement of the openings that may not be possible when trenches in the backside of the wafer are used.

The method may further include removing material from the backside of the wafer until the trenches in the major surface of the substrate are exposed. This may be achieved by backside grinding or polishing of the wafer. This may allow any excess material of the wafer incorporating features such as the trenches or holes described to be removed, thereby to reduce the volume of the resulting chip scale packages. The removal of the material from the backside of the wafer may typically be carried out after the encapsulant has been deposited.

As noted above, the provision of the plurality of openings in the wafer may allow the encapsulant to be deposited via the backside of the wafer, whereby there may be no need to keep the major surface uncovered while the encapsulant is deposited. In some examples a protective foil may be placed over the contacts on the major surface prior to depositing the encapsulant. Use of a protective foil, which can prevent damage to the contacts, is generally not possible in methods that require access to the front of a wafer for depositing an encapsulant. Accordingly, embodiments of this invention can allow a wafer based approach to making chip scale packages, which may also allow a protective foil to be used.

According to another aspect of the invention, there is provided a semiconductor wafer comprising:

a major surface;

a backside;

a plurality of contacts located on the major surface;

a plurality of trenches in the major surface of the substrate; and a plurality of openings in the wafer between the backside and the trenches in the major surface.

An encapsulant may be located in the openings in the wafer and in the trenches in the major surface.

A plurality of trenches may be located on the backside of the wafer. The openings may be located at intersections between the trenches in the major surface and the trenches in the backside of the wafer.

The trenches in the major surface and in the backside of the substrate may be arranged in a grid. The trenches in the backside may be offset with respect to the trenches in the major surface.

The openings may be formed by holes extending between the backside of the wafer and the trenches in the major surface.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Figure 1A:
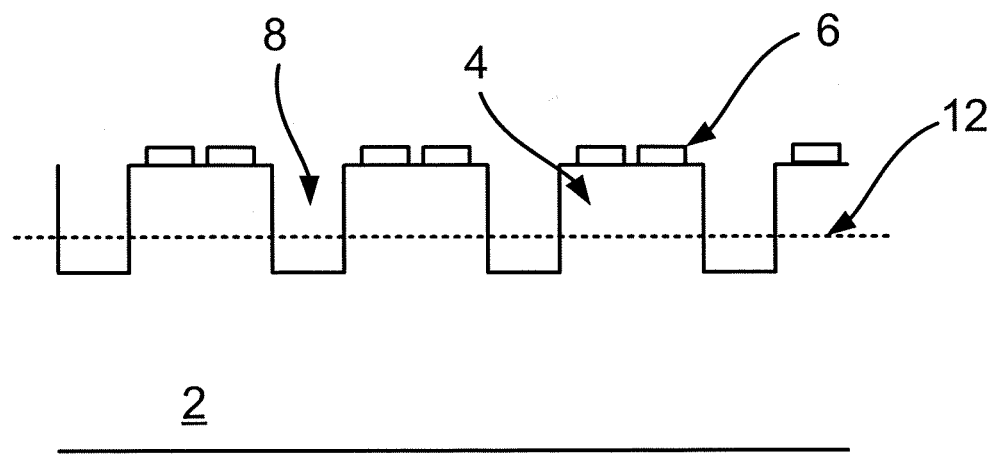
FIG. 1A shows a semiconductor wafer during the manufacture of a plurality of chip scale packages.
Figure 1B:
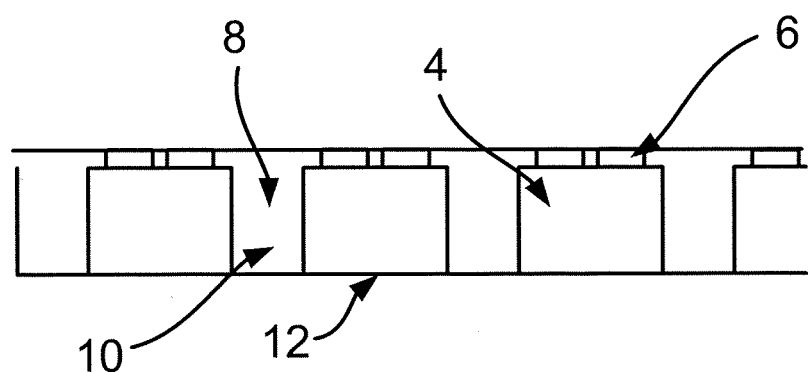
FIG. 1B shows the wafer of FIG. 1A after an encapsulant has been deposited and back grinding has been performed.

FIGS. 1A and 1B show the various stages in the manufacture of a plurality of chip scale packages. FIG. 1A, shows a semiconductor wafer 2 such as a silicon wafer, which is subsequently to be singulated to produce the chip scale packages, each package including a die 4 formed from a part of the wafer 2. The wafer has a major surface and a backside.

The wafer 2 may be processed using front end of line (FEOL) processing steps for forming one or more active devices within the wafer (e.g. transistors and/or other active components). Each die 4 that is singulated from the wafer 2 may include similar or identical components, for manufacturing a large number of like devices from the wafer 2, as is known in the art.

Front end processing of the wafer 2 may be followed with one or more back end of line (BEOL) processing steps. This back end processing may include steps for forming contacts such as contacts 6 for each die 4 on the major surface of the wafer 2.

To provide protection for the side walls of each die 4, a mould compound (also referred to herein as an encapsulant) may be deposited onto each die 4. This can allow the side walls of each die 4 to be insulated from the surrounding environment. For instance, when the contacts 6 of each die are soldered to the surface of a carrier such as a printed circuit board, an excess of solder may make contact with the side walls of the die 4, which can lead to unwanted capacitive coupling and/or electrical shorting.

After the contacts 6 for each die 4 have been formed, a number of trenches 8 may be formed within the wafer 2. These trenches may be formed using, for example, sawing or partial plasma dicing. As shown by the dotted line 12 in FIG. 1A, the depth of the trenches 8 may be slightly deeper than the desired final thickness of each chip scale package. This can ensure that substantially all of the side walls of each resulting chip scale packages may be covered with the encapsulant. After the trenches 8 have been formed, an encapsulant may be deposited over the wafer 2 to fill the trenches 8.

After the encapsulant 10 has been deposited, any excess encapsulant located above the contacts 6 on the major surface of the wafer 2 can be grinded back in order to ensure that the contacts 6 are exposed. Also, any excess material on the backside of the wafer 2 can be grinded back to the dotted line 12 shown in FIG. 1A. After grinding away the backside of the wafer 2 and any excess encapsulant from the major surface of the wafer 2, the arrangement shown in FIG. 1B may be reached. Each die 4 in FIG. 1B is separated from each neighboring die 4 in FIG. 1B by the encapsulant 10 that was deposited into the trenches 8 shown in FIG. 1A.

This approach to forming a plurality of chip scale packages can be finished off by singulating the arrangement shown in FIG. 1B to separate each die 4 from each neighboring die 4. The singulation can take place substantially along the same lines on which the trenches 8 shown in FIG. 1A were formed. The singulation can be achieved again by, for example, sawing or by plasma dicing. When the dies 4 shown in FIG. 1B are singulated, the sawing should leave at least a portion of the encapsulant 10 remaining on the side walls of each die, to prevent shorting or capacitive coupling of excess solder to the side walls as noted above.

A disadvantage with the approach described above in relation to FIGS. 1A and 1B is that the process of back grinding excess encapsulant from the major surface of the wafer 2 to expose the contacts 6 on the major surface can lead to substantial damage of the contacts 6 themselves.

The process in FIGS. 1A and 1B is a wafer based approach in which the process for applying the encapsulant and back grinding excess encapsulant and semiconductor material from the wafer 2 were performed prior to singulation.

Figure 2A:
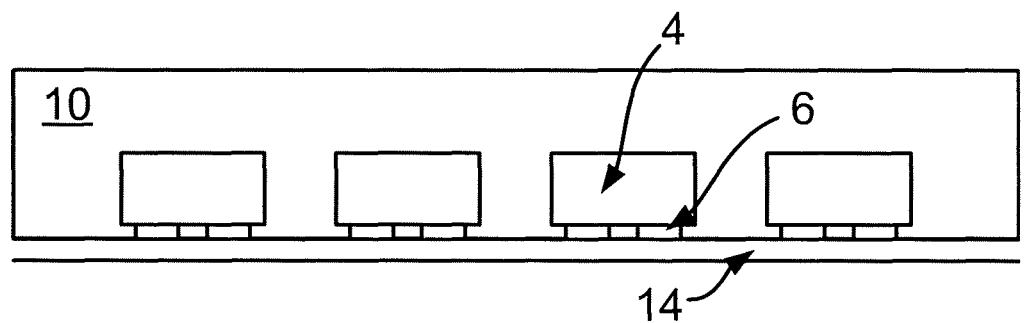
FIGS. 2A and 2B each show a stage in another process for manufacturing a plurality of chip scale packages.
Figure 2B:
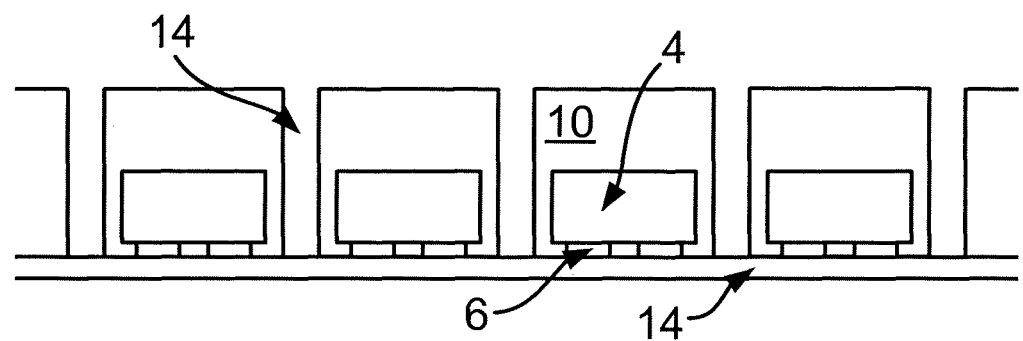

An alternative approach for forming a plurality of chip scale packages is shown in FIGS. 2A and 2B. Unlike the process in FIGS. 1A and 1B, the approach shown in FIGS. 2A and 2B applies the encapsulant after singulation of the semiconductor wafer has already been performed.

As shown in FIG. 2A, the singulated dies 4 that result from singulating a wafer are placed on a protective foil 14 with the major surface of each die 4 having the contacts 6 facing downwards. An encapsulant 10 is then deposited over the protective foil 14 and the dies 4. Note that the encapsulant 10 fills the gaps between the dies 4. As shown in FIG. 2B, the structure including the dies 4 and the encapsulant 10 can then be singulated to form a plurality of chip scale packages.

An advantage of the approach shown in FIGS. 2A and 2B is that no back grinding of excess encapsulant from the major surface including the contacts 6 of each die 4 is necessary. The protective foil 14 can protect the major surface of each die 4 including the contacts 6 during the encapsulation process.

Nevertheless, a disadvantage of the approach taken in FIGS. 2A and 2B is that it is relatively complicated (and therefore expensive) in view of the need to place each individual die 4 on the protective foil 14 and subsequently to remove the protective foil 14 after singulation. Typically, wafer based approaches (such as that described above in relation to FIGS. 1A and 1B) are simpler to implement and are therefore cheaper.

Embodiments of this invention may provide a method of making a plurality of semiconductor devices comprising chip scale packages. The plurality of chip scale packages may each include a semiconductor (e.g. silicon) die having a major surface and a backside. The die of each chip scale package may have one or more contacts provided on its major surface and may further include an encapsulant that at least partially covers the side walls of each die. The encapsulant may provide structural strength for the package as a whole and may also provide environmental protection for the semiconductor die. The encapsulant on the sidewalls may, in particular, prevent capacitive coupling or electrical shorting to the side walls by excess solder used to mount the chip scale package on the surface of a carrier such as a printed circuit board as mentioned above.

In accordance with embodiments of this invention, a wafer based approach to encapsulation may be taken, without necessarily needing to deposit the encapsulant over the major surface of the wafer. In this way, back grinding of excess encapsulant, which might lead to damage of the contacts on the major surface, may be avoided. In some examples, a protective foil may be used to provide further protection for the contacts on the major surface of each die during manufacture.

A method according to an embodiment of this invention can include providing a semiconductor wafer such as a silicon wafer having a major surface and a backside. Front end processing steps can be used to form active components (e.g. transistors) therein. Thereafter, back end processing steps may be performed, e.g. to provide one or more contacts for each die of the wafer on a major surface thereof.

After formation of the contacts on the major surface, a plurality of trenches may be formed in the major surface of the substrate (i.e. the surface of the wafer on which the contacts are formed). These trenches may be formed by, for example, partial sawing or plasma dicing of the wafer through the major surface thereof, to a depth that is shallower than the thickness of the wafer.

The layout of the trenches in the wafer may correspond to the eventual sawing lines for singulating the wafer to form the chip scale packages as described below. As such, the trenches in the major surface may separate or at least partially separate each die of each respective chip scale package.

In a next step, a plurality of openings may be formed in the wafer between the backside of the wafer and the trenches in the major surface. As will be described below, a number of different methods are envisaged for forming these openings. The openings can provide passages for an encapsulant, that is subsequently deposited over the backside of the wafer, to pass into the trenches located in the major surface of the wafer. The encapsulant passing through the openings in the wafer may thus fill the trenches in the major surface of the wafer in a manner that does not require the encapsulant to be deposited directly over the major surface of the wafer. Back grinding of excess encapsulant from the major surface may therefore be avoided and a protective foil may be used to protect the major surface as noted above.

After the encapsulant has been deposited, the wafer can be singulated to produce the plurality of chip scale packages.

A first example for the formation of the openings in the wafer between the backside thereof and the trenches in the major surface will be described below in relation to FIGS. 3-5. In this example, formation of the openings in the wafer is achieved by forming a plurality of trenches in the backside of the wafer. The trenches in the backside of the wafer may be formed to a depth such that they reach the trenches in the major surface of the wafer. The locations(s) at which the trenches in the backside of the wafer intersect with the trenches in the major surface of the wafer may thus create openings between the backside of the wafer and the trenches in the major surface.

Figure 3:
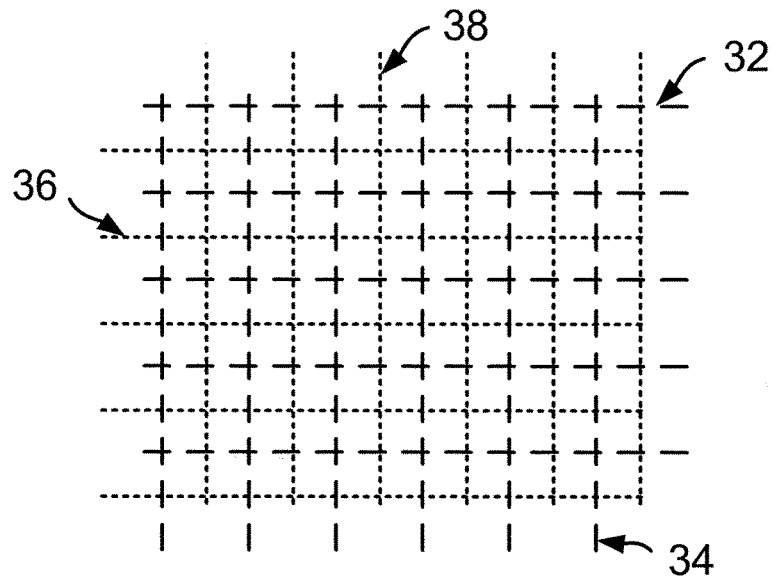
FIG. 3 shows an example of the layout of trenches formed in a major surface and in a backside of a wafer during the manufacture of a plurality of chip scale packages according to an embodiment of this invention.

FIG. 3 shows an example of the layout of the trenches in the major surface of a wafer and in the backside of a wafer in accordance with an embodiment of this invention. As can be seen in FIG. 3, the trenches 32, 34 formed in the major surface of the wafer are provided in the form of a grid. In this example, the grid is a square grid such that each die which will eventually be singulated from the wafer to form the plurality of chip scale packages is square. Although each die in this example is square, it is envisaged that other shapes (such as oblong) are possible.

The layout of the plurality of trenches 36, 38 formed in the backside of the wafer in the example of FIG. 3 is also shown. In this example, the trenches 36, 38 in the backside of the wafer also take the form of a grid. Again, however, other layouts are envisaged for much the same reasons as noted above in respect of the trenches 32, 34.

As can be seen in FIG. 3, the trenches 32 in the major surface of the substrate intersect in a number of locations with the trenches 38 formed in the backside of the wafer. Similarly, the trenches 34 formed in the major surface of the substrate intersect with the trenches 36 formed in the backside of the wafer in a number of places. Assuming that the combined depth of the trenches 32, 34 and the trenches 36, 38 is at least equal to the total thickness of the wafer, the intersection of the trenches will lead to the formation of openings through the wafer. These openings can allow an encapsulant that is subsequently deposited over the backside of the wafer to reach the trenches 32, 34 formed on the major surface of the wafer.

The trenches in the backside of the wafer need not be provided in the form of a grid. Also the trenches in the backside of the wafer need not take the same shape or configuration as the trenches in the major surface of the wafer. In one example, it is envisaged that the trenches in the backside of the wafer may comprise a plurality of substantially parallel trenches extending across the backside of the wafer, wherein each trench on the backside intersects with a plurality of the trenches in the major surface in one or more locations, thereby to form a plurality of openings in the wafer between the backside and the trenches in the major surface.

Figure 4:
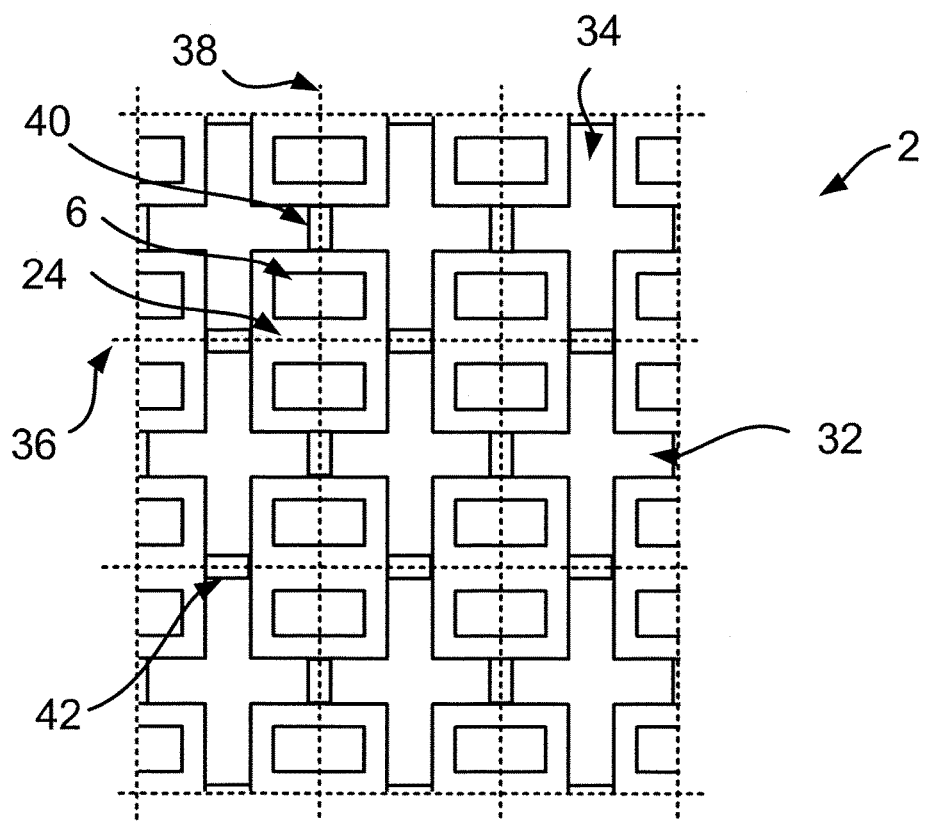
FIG. 4 shows a semiconductor wafer during the manufacture of a plurality of chip scale packages according to an embodiment of this invention.

FIG. 4 shows part of a wafer 2 during manufacture using backside trench approach for creating the openings in the wafer 2 as described above. The view in FIG. 4 is from above the major surface of the wafer 2. The wafer 2 includes a plurality of dies 24. The dies 24 are separated from each other by trenches 32, 34 that are located in the major surface of the wafer 2. Note that in common with the example of FIG. 4, the trenches 32, 34 in FIG. 4 form a grid (although in contrast to FIG. 3, the grid of trenches 32, 34 in FIG. 4 is not a square grid and each die 24 has an oblong shape when viewed from above the major surface). Each die 24 includes one or more contacts 6 its major surface thereof.

The dotted lines 36, 38 in FIG. 4 show the layout of the trenches formed in the backside of the wafer in this example. Once again, although the layout of the trenches 36, 38 is similar to the layout of the trenches 32, 34 in this example, it is envisaged that the layouts of the trenches formed in the major surface and in the backside of the wafer may be different.

FIG. 4 shows that at the locations at which the trenches 32 in the major surface intersect with the trenches 38 in the backside of the wafer 2, openings 40 are formed between the backside of the wafer and the trenches 32. Similarly, at the locations at which the trenches 34 in the major surface of the wafer intersect with the trenches 36 formed in the backside of the wafer, openings 42 are formed.

In the examples described in relation to FIGS. 3 and 4, the grids of trenches formed in the major surface of the wafer and in the backside of the wafer are offset with respect to each other. In particular, and as is most clearly shown in FIG. 3, the amount of offset may be chosen such that it is substantially equal to approximately half the pitch of the trenches.

By using a smaller pitch for the trenches on the backside of the wafer, more intersection points between the trenches on the major surface of the wafer and on the backside of the wafer may be formed, leading to the generation of additional openings. This may allow for easier access to the trenches in the major surface by an encapsulant deposited over the backside of the wafer. However, the creation of additional trenches may increase the cost of the overall process. It is believed that the choice of a pitch for the backside trenches which is roughly the same as the pitch of the trenches in the major surface, and the use of an offset between the trenches on the major surface and on the backside of the wafer that is approximately equal to half the pitch between the trenches may provide an optimal balance between cost and accessibility to the trenches on the major surface by the encapsulant.

Figure 5:
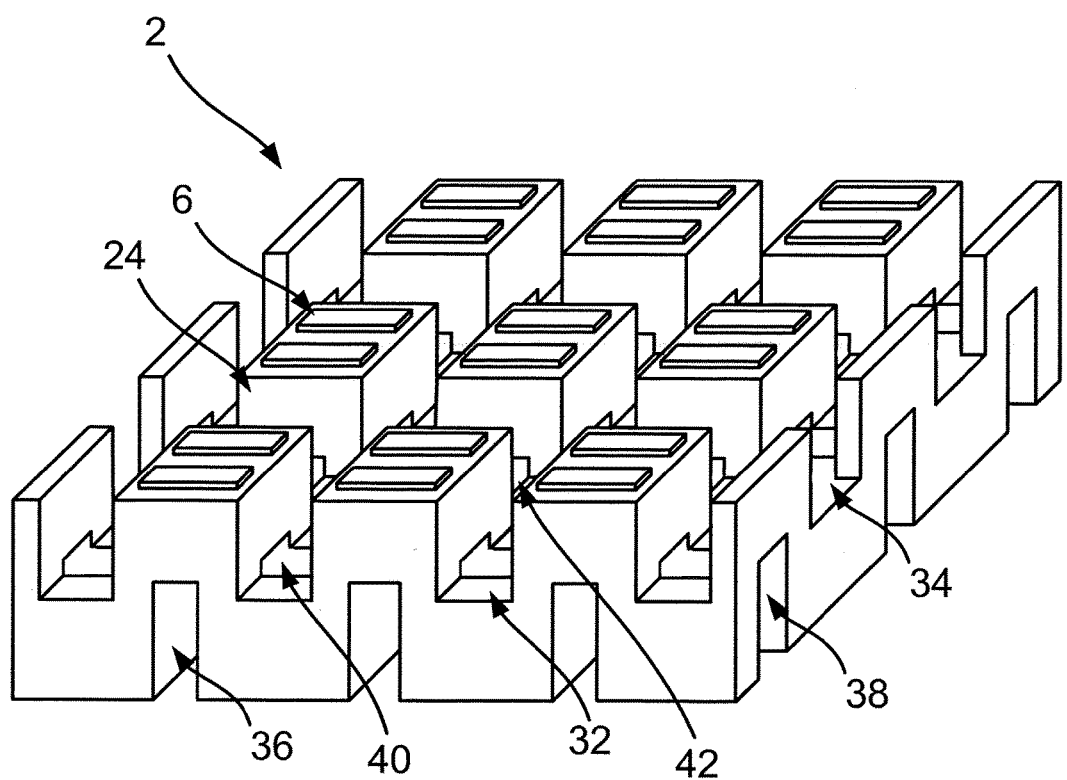
FIG. 5 shows a semiconductor wafer during the manufacture of a plurality of chip scale packages according to an embodiment of this invention.

FIG. 5 shows another view of section of a wafer 2 of the kind shown in FIG. 4. As is more clearly seen in FIG. 5, the individual dies 24 in the wafer 2 are laterally separated from each other by the trenches 32, 34 in the major surface of the wafer 2. Note that after the trenches 32, 34 have been formed, the wafer 2 may be optionally placed major surface down on a protective foil for protecting the contacts 6 while an encapsulant is deposited over the backside of the wafer 2. After the encapsulant has been deposited, the protective foil may be removed to reveal the contacts 6. Note that the protective foil may prevent encapsulant that passes through the openings in the wafer from flowing over the tops of the contacts 6. Accordingly, the use of the protective foil may avoid the need for back grinding of any excess encapsulant from the major surface of the wafer.

After the encapsulant has been deposited, back grinding from the backside of the wafer 2 may be used to remove any excess material from the backside of the wafer. For instance, the back grinding of the backside of the wafer may be performed until the trenches 36, 38 in the backside are completely removed and/or the trenches 32, 34 in the major surface become exposed. Thereafter, the remaining structure may be singulated to form a plurality of chip scale packages, each chip scale package including one of the dies 24. Singulation of the dies 24 may be performed to leave at least some encapsulant from the trenches 32, 34 covering the side walls of the dies 24 of each chip scale package, to provide protection therefor as noted above.

In some examples, the trenches in the major surface may have a depth $d_{major}$ and the trenches in the backside may have a depth $d_{backside}$. The depth of the trenches in the major surface and in the backside of the wafer may be chosen so that their combined depth is at least equal to the total thickness of the wafer $T_{wafer}$. In some examples, the combined depth of the trenches in the major surface and in the backside may be chosen to be greater than the total thickness of the wafer ($d_{major}+d_{backside}>T_{wafer}$). In this way, a degree of tolerance can be built in to the manufacturing process, such that even if the exact depth of some of the trenches does not reach the intended depth, the generation of the openings at the intersections between the trenches may nevertheless still be achieved. Moreover, the increase in the combined depth of the wafers may increase the effective size of the individual openings for easier access by the encapsulant to the trenches in the major surface.

Figure 6:
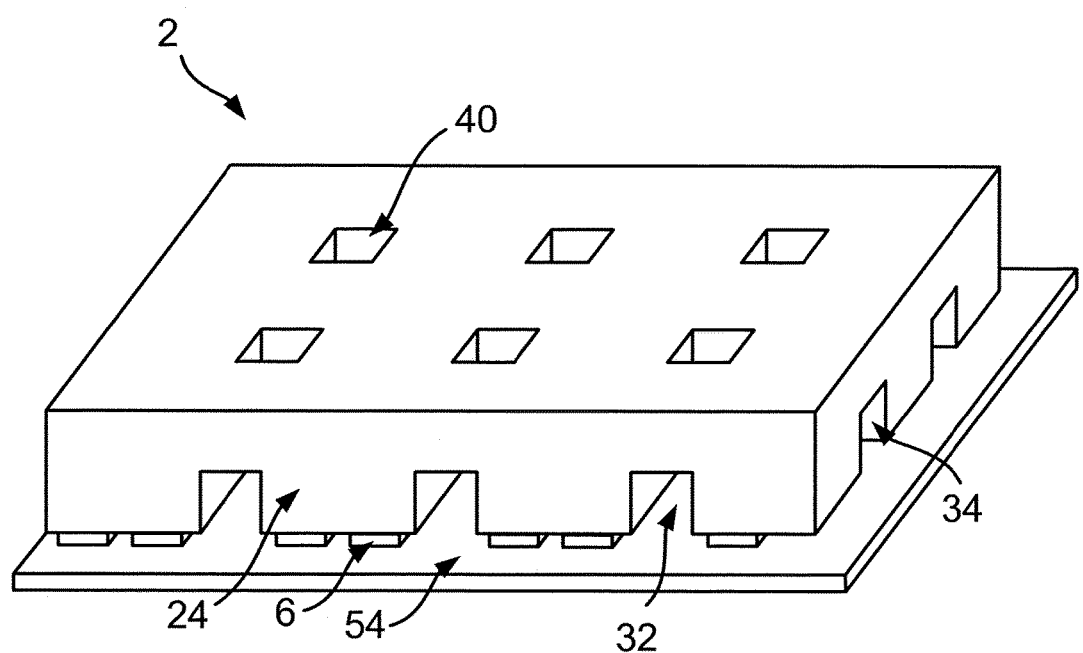
FIG. 6 shows a semiconductor wafer during the manufacture of a plurality of chip scale packages according to an embodiment of this invention.

FIG. 6 shows another approach for forming a plurality of openings in the wafer 2 between the backside of the wafer 2 and the trenches in the major surface. As can be seen in FIG. 6, in common with the examples described above in relation to FIGS. 3-5, a plurality of trenches 32, 34 may be formed in the major surface of the wafer 2. The formation of the trenches 32, 34 may define a plurality of dies 24, where each die 24 corresponds to one of the chip scale packages that will be produced following singulation of the wafer 2. Each die 24 may include one or more contacts 6 on a major surface thereof as noted above.

FIG. 6 also shows that in this example as noted above, the wafer 2 may be placed on a protective foil 54, with the contacts 6 on the major surface facing downwards, while the encapsulant is deposited over the backside of the wafer 2.

In the example of FIG. 6, the openings in the wafer 2 may be formed using a plurality of holes 40 that extend between a backside of the wafer and the trenches 32, 34 in the major surface. The use of holes 40 in this way may allow for more selective positioning of the openings in the wafer 2, in contrast to the use of trenches in the backside, which may lead to the generation of openings at each and every intersection point between the trenches in the backside and the 32, 34 trenches in the major surface.

The holes 40 may be formed using, for example, partial plasma dicing or mechanical drilling. The holes 40 may be provided in a regular array as shown in FIG. 6 or in some other configuration. The number and positioning of the holes 40 may be chosen to provide sufficient access of the encapsulant deposited over the backside of the wafer 2 to the trenches 32, 34 in the major surface.

In common with the example described above in relation to FIGS. 3-5, after the encapsulant has been deposited over the backside of the wafer 2 and has entered the trenches 32, 34 in the major surface through the holes 40, the backside of the wafer may be back grinded to expose the trenches 32, 34. The protective foil 54 may then be removed and the structure may be singulated to produce a plurality of chip scale packages. Each chip scale package may include one of the dies 24 shown in FIG. 6, where the side walls of each die 24 are at least partially covered with the encapsulant.

Accordingly, there has been described a method of making a plurality of semiconductor devices comprising a chip scale packages. The method includes providing a semiconductor wafer having a major surface and a backside. The method also includes forming a plurality of contacts on the major surface. The method further includes forming a plurality of trenches in the major surface of the substrate. The method also includes forming a plurality of openings in the wafer between the backside and the trenches in the major surface. The method further includes depositing an encapsulant on the backside of the wafer. At least some of the encapsulant passes through the openings in the wafer to at least partially fill the trenches in the major surface. The method also includes singulating the wafer to produce a plurality of chip scale packages having a major surface including one or more contacts and side walls at least partially covered with said encapsulant.

Although particular embodiments of the invention have been described, it will be appreciated that many modifications/additions and/or substitutions may be made within the scope of the claimed invention.

The invention claimed is:

1. A method of making a plurality of semiconductor devices comprising chip scale packages, the method comprising:
    providing a semiconductor wafer having a major surface and a backside;
    forming a plurality of contacts on the major surface;
    forming a plurality of trenches in the major surface of the substrate;
    forming a plurality of openings in the wafer between the backside and the trenches in the major surface;
    depositing an encapsulant on the backside of the wafer, wherein at least some of the encapsulant passes through the openings in the wafer to at least partially fill the trenches in the major surface; and
    singulating the wafer along the trenches to produce said plurality of chip scale packages, each chip scale package having the major surface including one or more of the contacts and side walls at least partially covered with the encapsulant.

2. The method of claim 1, wherein said forming of the openings in the wafer between the backside and the trenches in the major surface comprises forming a plurality of trenches in the backside of the wafer, and wherein the openings are formed at intersections between the trenches in the major surface and the trenches in the backside of the wafer.

3. The method of claim 2, wherein the trenches in the backside of the substrate and in the major surface of the substrate are arranged in a grid.

4. The method claim 3, wherein the trenches in the backside have a pitch that is the same as a pitch of the trenches in the major surface.

5. The method claim 3, wherein the trenches in the backside are offset with respect to the trenches in the major surface when viewed from above the major surface.

6. The method of claim 5, wherein the offset between the trenches in the back side and the trenches in the major surface is substantially equal to one half the pitches of the trenches in the back side and the trenches in the major surface.

7. The method of claim 2, wherein the wafer has a thickness $T_{wafer}$, wherein the trenches in the major surface have a depth $d_{major}$ and the trenches in the backside have a depth $d_{backside}$, and wherein $d_{major}+d_{backside}>T_{wafer}$.

8. The method of claim 1, wherein said forming the plurality of openings in the wafer between the backside of the wafer and the trenches in the major surface comprises forming a plurality of holes extending between the backside of the wafer and the trenches in the major surface.

9. The method of claim 1, further comprising removing material from the backside of the wafer until the trenches in the major surface of the substrate are exposed.

10. The method of claim 1, further comprising placing a protective foil over the contacts on the major surface prior to depositing the encapsulant.

\* \* \* \* \*